United States Patent [19]

White et al.

[11] Patent Number: 4,608,647

[45] Date of Patent: Aug. 26, 1986

[54] METHOD AND APPARATUS FOR DETERMINING THE NOISE POWER RATIO (NPR) OF A UNIT UNDER TEST

[75] Inventors: Thomas E. White, Richardson; Brooks C. Fowler, Dallas, both of Tex.

[73] Assignee: E-Systems, Inc., Dallas, Tex.

[21] Appl. No.: 544,494

[22] Filed: Oct. 24, 1983

[51] Int. Cl.[4] .................... G01R 29/26; G06F 15/332
[52] U.S. Cl. ................. 364/481; 324/57 N; 324/77 B; 328/162; 364/576; 455/115
[58] Field of Search ........... 364/481, 485, 576; 324/77 A, 77 B, 57 N; 328/141, 162; 455/115

[56] References Cited

U.S. PATENT DOCUMENTS

| | | | |
|---|---|---|---|
| 3,355,668 | 11/1967 | Boensel et al. | 328/162 |
| 3,693,076 | 9/1972 | Nugent et al. | 324/57 N |
| 3,825,835 | 7/1974 | Hammett et al. | 324/57 N |
| 3,978,401 | 8/1976 | Lum | 324/57 N |
| 4,286,326 | 8/1981 | Houdard | 324/77 B |

OTHER PUBLICATIONS

B. P. Lath, "Modern Digital & Analog Communication Systems" 1983, pp. 16-37 and 454-460 Textbook, Holt, Rinehart and Winston (Publishers).

*Primary Examiner*—Felix D. Gruber
*Attorney, Agent, or Firm*—Albert M. Crowder, Jr.

[57] ABSTRACT

The present invention describes a method and apparatus for determining the noise power ratio (NPR) of a unit under test (UUT). According to the method, a frequency domain representation of a desired test spectrum is generated by prompting an operator to input selected parameters to a general purpose digital computer. The desired test spectrum includes a notch of predetermined depth. The frequency domain representation is transformed into an input signal sequence by an inverse Fast Fourier Transform algorithm, the sequence defining a time domain representation thereof. The input signal sequence is then applied to the unit under test. An output signal sequence defining a time domain representation of a measured test spectrum is received from the unit under test and transformed back into a frequency domain representation. This frequency domain representation includes a notch whose depth is normalized in dB to determine the noise power ratio of the unit under test.

18 Claims, 2 Drawing Figures

METHOD AND APPARATUS FOR DETERMINING THE NOISE POWER RATIO (NPR) OF A UNIT UNDER TEST

TECHNICAL FIELD

The present invention relates generally to testing of signal processing elements and particularly to a method and apparatus for providing a programmable test signal to a unit under test to determine the noise power ratio of the unit.

BACKGROUND OF THE INVENTION

The noise power ratio (NPR) of a signal processing element is a measure of its ability to pass a noise loaded input spectrum, shaped to have a notch, without contamination of the notch. This ratio, which is useful in expressing the dynamic range of the signal processing element, is determined by applying a notched input noise spectrum to the element and measuring the contamination in the output notch. Specifically, the depth of the notch in the processed spectrum is examined to determine the noise power ratio of the element.

The above testing method has proven generally effective for estimating the noise power ratio of various signal processing elements and circuits. However, in prior art NPR testers, the input noise spectrum is generated by hardware modules which must be physically plugged into the tester. Each of these modules produces a different input noise spectrum, and therefore to change the spectrum applied to the unit, the operator must physically remove the module from the tester. Moreover, with such a system the operator cannot individually tailor the input spectrum to a specific unit under test. Further, prior art noise power ratio testers are incapable of simultaneously handling both analog and digital signals, and thus systems having one type of signal input and another type of output cannot be effectively tested.

There is therefore a need for an improved method and apparatus for determining the noise power ratio of a unit under test which obviates such plug-in modules for producing the input noise spectrum, and which can accommodate both analog and digital signals.

SUMMARY OF THE INVENTION

The present invention describes a method and apparatus for determining the noise power ratio (NPR) of a unit under test. In the method, a frequency domain representation of a desired test spectrum is generated in accordance with test parameters input to the apparatus by an operator through a prompting scheme. The spectrum has a notch therein of predetermined depth, width and center and 3 dB frequencies. The frequency domain representation is then transformed into an input signal sequence defining a time domain representation thereof. This input signal sequence is then applied to the unit under test. Subsequently, an output signal sequence from the unit under test is received, the sequence defining a time domain representation of a measured spectrum. The output signal sequence is then transformed back into a frequency domain representation. The measured test spectrum has a notch whose depth is then normalized in dB to determine the noise power ratio of the unit under test.

In accordance with the invention, a general purpose digital computer is provided for producing the frequency domain representation of the desired test spectrum. A memory associated with the computer includes a time-to-frequency domain conversion algorithm, and frequency-to-time domain conversion algorithm, e.g., a Fast Fourier Transform algorithm and its inverse, for transforming the output signal sequence into the measured test spectrum, and for transforming the desired test spectrum into the input signal sequence, respectively. The apparatus also includes special purpose hardware for applying the input signal sequence to the unit under test and receiving the output signal sequence therefrom. In particular, the special purpose hardware includes RAM storage for storing a digital representation of the input and output signal sequences. The hardware also includes a digital-to-analog converter, and an analog-to-digital converter for providing full hybrid signal capability.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
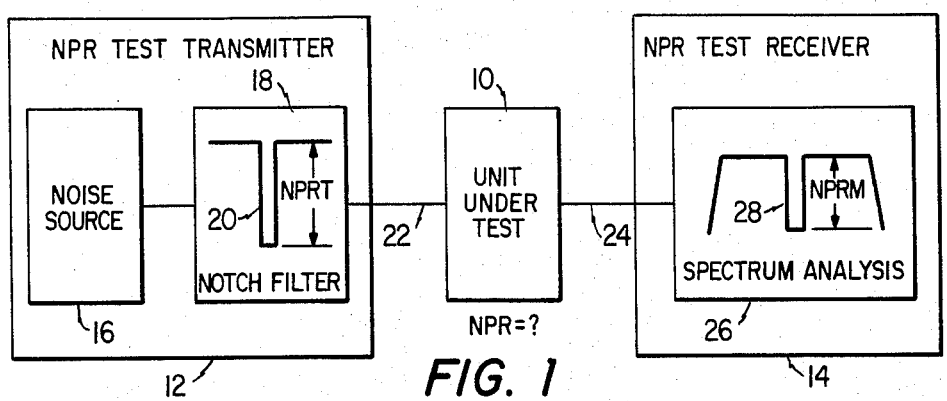
FIG. 1 is a schematic diagram of the general purpose noise power ratio (NPR) testing apparatus of the present invention.

With reference to the drawings wherein like reference characters designate like or similar parts throughout the several views, FIG. 1 is a schematic diagram of a general purpose noise power ratio (NPR) testing apparatus of the present invention. As seen in FIG. 1, a unit under test 10, whose noise power ratio is to be determined, is connected between an NPR test transmitter 12 and an NPR test receiver 14. The transmitter 12 includes a noise source 16 which, in the preferred embodiment of the invention, is a white noise signal generator. A white noise signal has equal energy distribution over all frequencies of interest, regardless of the center frequency of the frequency range being considered. As will be described in more detail below, the NPR test transmitter 12 includes a programmable digital computer and associated memory and peripheral devices, through which an operator generates a frequency domain representation of a desired test spectrum. In particular, in accordance with the present invention, a prompting routine initiated by the computer prompts the operator to input various test parameters which define the desired test spectrum 18. As seen in FIG. 1, this spectrum includes a notch 20 whose depth is defined as NPRT.

The desired test spectrum 18 is transmitted by the NPR test transmitter 12 to the unit under test 10 via the output line 22. In operation, the unit under test 10 contaminates the notch in the desired test spectrum 18 to produce a notch 28 whose depth is defined as NPRM. The NPR test receiver 14 receives the output signal from the unit under test 10 via the input line 24. As will be described in more detail below, this output signal is then transformed back into the frequency domain to produce the measured test spectrum 26. In accordance with the present invention, the noise power ratio in dB of the unit under test 10 is then calculated by taking the logarithmic ratio of the notch depths NPRT and NPRM.

Figure 2:
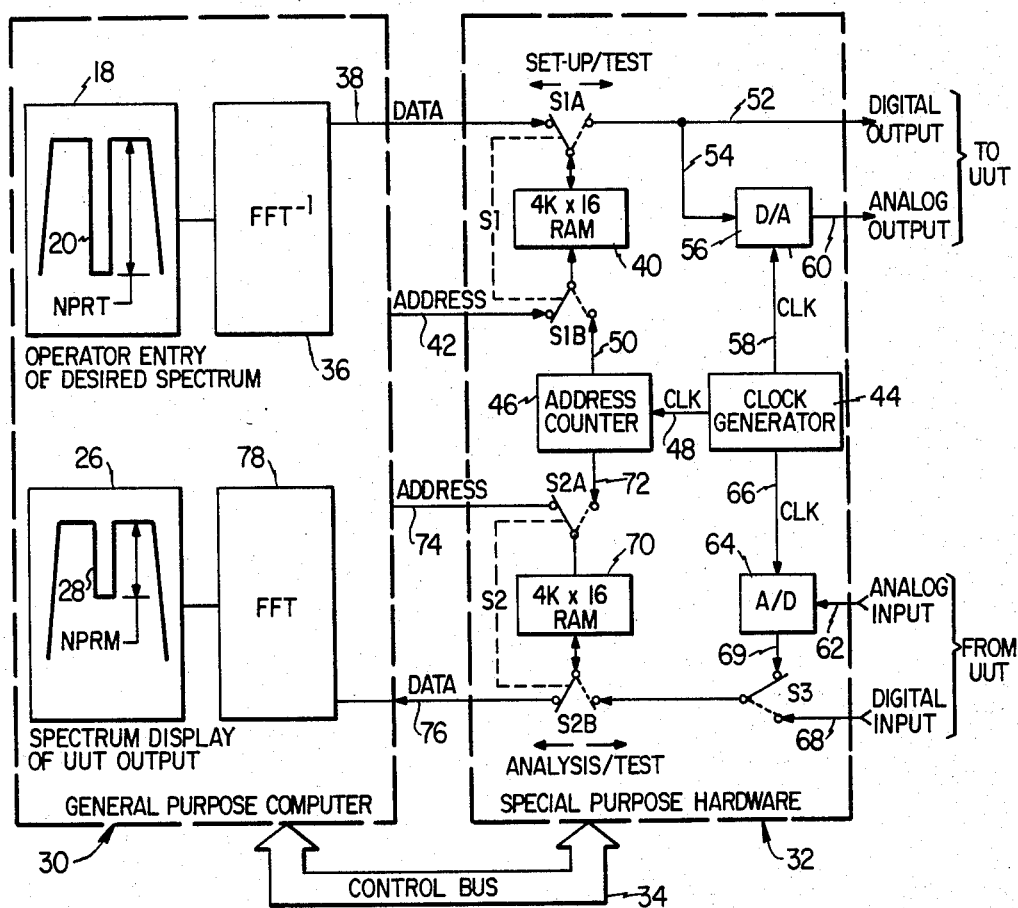
FIG. 2 is a detailed schematic of the NPR testing apparatus of FIG. 1.

Referring now to FIG. 2, a detailed schematic of the NPR test apparatus of FIG. 1 is shown. Generally, this apparatus includes a general purpose digital computer 30 and a special purpose hardware section 32. Although not shown, the computer 30 includes associated memory and standard peripheral devices such as a keyboard, display, printer, etc. As will be described in detail below, the computer 30 controls the operation of the hardware section 32 through control signals applied thereto over control bus 34.

As described above, the present invention includes a method for determining the noise power ratio of a unit under test wherein an operator is prompted to generate a frequency domain representation of a desired test spectrum. In particular, a conventional prompting routine is stored in a memory device in the computer 30 and once initiated, provides prompt requests to the operator through a visual display. In response to such requests, the operator inputs, via a keyboard or the like, various test parameters. Specifically, in the preferred embodiment of the invention the computer prompts the operator to input the following test parameters:

$F_L$—Noise Spectrum Lower 3 dB Frequency
$F_U$—Noise Spectrum Upper 3 dB Frequency
$F_N$—Notch Center Frequency
$F_W$—Notch Width
$F_S$—Digital Sample Frequency
$F_R$—Receive Notch Frequency The prompting routine will initially prompt the operator for an input using a message displayed on a prompt line of the visual display associated with the computer 30. For example, the system may display on the prompt line the following message:

Type Value For "Noise Spectrum Lower 3dB Frequency"; press ENTER:

The operator then keys in the requested information and presses an ENTER key on the keyboard to enter this test parameter into the system. The routine then continues to prompt the operator to input the remainder of the text parameters noted above.

Ideally, the notch 20 in the desired test spectrum 18 would be infinitely deep since in such a case, the depth NPRM of the notch in the measured test spectrum 26 would then be equal to the NPR of the unit. However, in practice a notch depth that is equal to or greater than the expected noise power ratio (in dB) of the unit under test must be used. The value of this notch depth may also be selected by the operator, or alternatively, preprogrammed into the computer 30.

In response to the prompt requests, the data defining the above test parameters is input to the apparatus. This data is then formatted in the computer 30 to produce a 4096 point frequency domain representation of the desired test spectrum 18. In particular, the computer includes a routine which receives the lower 3 dB point and the left endpoint of the notch as inputs, and generates a set of coefficients representing a straight line between such points. Likewise, the routine also generates a straight line between the right endpoint of the notch and the upper 3 dB point. By this routine, the desired test spectrum, including a notch 20 of predetermined depth, notch width, center and 3 dB frequencies, is generated.

Referring back to FIG. 2, the frequency domain representation of the desired test spectrum 18 is then transformed into a time domain representation by a frequency-to-time domain conversion algorithm, preferably an inverse Fast Fourier Transform algorithm ($FFT^{-1}$) designated generally by the reference numeral 36. The $FFT^{-1}$ algorithm is stored in memory in the general purpose digital computer 30 and functions to generate an input signal sequence corresponding to the frequency domain representation of the desired test spectrum. The input signal sequence is then applied to the special purpose hardware section 32 of the NPR test apparatus via a data line 38.

The input signal sequence defining the time domain representation of the desired test spectrum is stored in a $4096 \times 16$ random access memory (RAM) 40 during a SET UP stage of the test. With reference to FIG. 2, a SET UP/TEST switch S1 includes a first single pole-double throw switch S1A which is moved to a first position as shown to connect the input signal sequence to the RAM 40. The input signal sequence is stored in the RAM 40 as a series of 4K words at locations therein determined by address signals supplied by the computer on address line 42. Specifically, these signals are applied to the RAM 40 via a second single pole-double throw switch S1B. The position of the SET UP/TEST switch S1 is determined by control signals supplied to hardware section 32 over control bus 34.

After the input signal sequence has been stored in the RAM 40, and in response to a control signal received by the hardware section 32 over the control bus 34, a TEST sequence is initiated with the switches S1A and S1B moving to the positions shown in the dotted lines. In particular, a digital sample frequency command is sent via the data bus 34 to control a clock generator 44 which in turn drives an address counter 46 via a clock signal on line 48. As discussed above, the digital sample frequency $F_S$ is selected by the operator through the prompt sequence before the test is run. The address counter 46 has a first output line 50 connected to the second pole of the switch S1B. Once the TEST sequence has been initiated, the clock generator 44 drives the address counter 46 to cycle through the desired test sequence 18 stored in the RAM 40 repetitively until stopped.

The input signal sequence representing the notched desired test spectrum is available as a 16-bit digital signal via the output line 52 or may be applied via an input line 54 to a digital-to-analog (D/A) converter 56 driven by the clock signal applied thereto from line 58. In operation, either the digital output on line 52 or the analog output of the D/A converter on line 60 may be applied to the unit under test.

During the TEST sequence, an output signal sequence defining a time domain representation of a measured test spectrum is received from the unit under test. With reference again to FIG. 2, this output signal sequence may be in either analog or digital form. If in analog form, the output signal sequence is applied via a line 62 to an analog-to-digital (A/D) converter 64 which is driven by the clock signal input thereto from a line 66. However, if the output signal sequence from the unit under test is in digital form, this signal is applied to the special purpose hardware section 32 via an input line 68. Depending on which type of input is applied to the special purpose hardware, a single pole-double throw switch S3 is utilized to connect either the output of the A/D converter on line 69, or the digital input on line 68, to an ANALYZE/TEST switch S2. During the TEST sequence, a single pole-double throw switch S2B is connected to its test terminal (as indicated by the dotted line) and the output signal sequence in digital form is routed to a second random access memory (RAM) 70. The RAM 70 is also connected to the single pole-double throw switch S2A which during the TEST sequence is connected to the address counter (as indicated by the dotted line) via a second output line thereof 72. When the output signal sequence is applied to the special purpose hardware 32, it is stored in the RAM 70 as a series of 4K digital words.

The output signal sequence defining a time domain representation of a measured test spectrum is then analyzed according to the method of the present invention for determining the noise power ratio of the unit under test. More specifically, during an ANALYSIS sequence, a control signal from the general purpose computer 30 is applied to the special purpose hardware 32 via the control bus 34 to activate S2. Specifically, via switch S2A, computer 30 accesses the RAM 70 through an address line 74 to cause the contents thereof to be applied via a data line 76 to a time-to-frequency domain conversion algorithm, preferably a Fast Fourier Transform algorithm designated generally by the numeral 78. As is well-known in the prior art, a FFT algorithm can be placed in storage in the general purpose computer and serves to transform the output signal sequence from the unit under test into a frequency domain representation of the measured test spectrum. As discussed above with respect to FIG. 1, the measured test spectrum 26 includes a notch 28 having a depth NPRM. In particular, the passage of the input signal sequence through the unit under test serves to contaminate the notch in the desired test spectrum by an amount proportional to the noise power ratio of the unit under test. Subsequently, the general purpose computer performs an analysis of the depth of the notch 28 of the measured test spectrum to determine the notch depth at the specified Receive Notch Frequency, $F_R$. The noise power ratio of the unit under test 10 is then calculated according to the following formula:

$$NPR_{UUT} = 10 \log (10^{-NPRM/10} - 10^{-NPRT/10}); \quad (1)$$

where:
NPRM = depth of notch 20 in dB
NPRT = depth of notch 28 in dB

Therefore, in accordance with the method of the present invention, the noise power ratio of a unit under test is determined by generating a frequency domain representation of a desired test spectrum, the spectrum having a notch of predetermined depth, width and center and 3 dB frequencies. This frequency domain representation is transformed into an input signal sequence defining a time domain representation thereof and applied to the unit under test. An output signal sequence is received from the unit defining a time domain representation of a measured test spectrum. The output signal sequence is then transformed back into a frequency domain representation. The measured test spectrum has a notch whose depth at the specified notch frequency is corrected according to equation (1) and printed on a spectral printout.

In accordance with an important feature of the present invention, the test apparatus prompts an operator to select various parameters of the desired test spectrum. This feature is advantageous since it allows different test spectrums to be applied to different types of signal processing elements. In prior art NPR testers, this capability required a plurality of plug-in hardware modules. Moreover, the test apparatus of the present invention is capable of handling both analog and digital signals to and from the unit under test. In particular, the output signal sequence from the unit under test may be either digital or analog. If the output is digital, it is routed to the RAM 70 and stored therein as a sequence of 4K words representing the time domain representation. However, if the output of the unit under test is analog, such output will be processed by the A/D converter 64 prior to storage of the 4K digital time domain representation.

It should be noted that the method and apparatus of the present invention accommodates frequency translations between the input and output signal sequences within the system. In particular, as described above an operator may select a Receive Notch Frequency $F_R$ during the prompting sequence of the test. If the input signal sequence has not been frequency translated in the unit under test, the Receive Notch Frequency $F_R$ defaults to the Notch Center Frequency $F_N$ during the analysis of the notch depth.

The method and apparatus for determining the noise power ratio of a unit under test of the present invention may utilize any well-known general purpose computer, for example, an HP9826 digital computer manufactured by Hewlitt Packard. Of course, the invention also utilizes standard peripheral devices such as a keyboard for inputting the test parameters, a display for displaying prompt information to the operator, and a printer for providing a printout of the desired and measured test spectrums. These elements have not been disclosed in detail since their precise structure is not critical to an understanding of the present invention. Moreover, the general purpose digital computer 30 includes various operating system programs for controlling the operation of the special purpose hardware and the movement of data therefrom to the general purpose computer. The operation of such programs are believed well within the scope of the prior art.

As noted above, the computer 30 includes a routine for generating a 4096 point frequency domain representation of the desired test spectrum. The following is a source code listing for this routine:

```
           LOGICAL IFILE*1
           DIMENSION XREAL(65536),XIMAG(65536),AMP(32768),HR(800),HI(800)
     88    FORMAT (0,5A4)
     90    FORMAT (I10)
           TYPE 300
    300    FORMAT('$','HOW MANY BITS OF ACCURACY DO YOU WANT => ')
           ACCEPT *, NBITS
           TYPE 305
```

```
305     FORMAT('$','NUMBER OF OUTPUT RECORDS (POWER OF 2) => ')
        ACCEPT *,LENGTH
        IF(LENGTH.LT.1) LENGTH=1
        IF(LENGTH.GT.64) LENGTH=64
        LENGTH=LENGTH*1024
        MIDDLE=LENGTH/2
        LOGLEN=INT(ALOG(FLOAT(LENGTH))/ALOG(2.0)+0.5)
        NBITS = NBITS - 9
        SCALE = 2.0**(NBITS)
        CALL ASSIGN(3,'NPR.DAT',0)
        ISEED = 3333
        DO 3000 I = 1,LENGTH
        XREAL(I) = 0.0
3000    XIMAG(I) = 0.0
        DO 4000 I = 2,MIDDLE
        J = LENGTH+2 - I
        U = 2*RAN(ISEED) - 1
        V = 2*RAN(ISEED) - 1
        Z = SQRT(U**2 + V**2)
        U = SCALE*U/Z
        V = SCALE*V/Z
        XREAL(I) =  U
        XIMAG(I) =  V
        XREAL(J) =  U
        XIMAG(J) = -V
        AMP(I) = SQRT(U**2 + V**2)
4000    CONTINUE
9333    TYPE 330
330     FORMAT('$','ENTER INITIAL NOTCH BIN => ')
        ACCEPT *,INIT
        TYPE 335
335     FORMAT('$','ENTER FINAL NOTCH BIN   => ')
        ACCEPT *,LAST
        IF(INIT.GT.MIDDLE.OR.LAST.GT.MIDDLE) GO TO 9333
        DO 9000 NDX1=INIT,LAST
        NDX2=LENGTH+2-NDX1
        XREAL(NDX1) = 0.0
        XIMAG(NDX1) = 0.0
        AMP(NDX1) = 0.0
        XREAL(NDX2) = 0.0
        XIMAG(NDX2) = 0.0
9000    CONTINUE
        TYPE 4200
4200    FORMAT (' ENTERING FIRST FFT')
        CALL EOBFFT(XREAL,XIMAG,LENGTH,LOGLEN)

DO 7000 I=1,LENGTH/1024
        WRITE(3) (XREAL((I-1)*1024+J),J=1,1024)
C       WRITE(3) (XIMAG((I-1)*1024+J),J=1,1024)
7000    CONTINUE

C               DO 4500 I = 1,800
C               HR(I) = XREAL(I)
C               HI(I) = XIMAG(I)
C       4500    CONTINUE
C               DO 4800 I = 1,3296
C               J = 800 + I
C               XREAL(I) = XREAL(J)
C               XIMAG(I) = XIMAG(J)
C       4800    CONTINUE
C               DO 5100 I = 1,800
C               J = 3296 + I
C               XREAL(J) = HR(I)
C               XIMAG(J) = HI(I)
C       5100    CONTINUE
C               DO 6000 I = 1,MIDDLE
C               U = XREAL(I)
C               V = XIMAG(I)
C               IF (U .GT. 0.0) K =  0.5 + U
C               IF (V .GT. 0.0) L =  0.5 + V
C               IF (U .LT. 0.0) K = -0.5 + U
C               IF (V .LT. 0.0) L = -0.5 + V
C               XREAL(I) = K
C               XIMAG(I) = L
C       6000    CONTINUE
C               TYPE 6200
C       6200    FORMAT (' ENTERING SECOND FFT')
C               CALL EOBFFT(XREAL,XIMAG,LENGTH,LOGLEN)
C               DO 6300 I = 1,MIDDLE
C               U = XREAL(I)
C               V = XIMAG(I)
C               W = U**2 + V**2
C               AMP(I) = SQRT(W)/FLOAT(LENGTH)
C               AMP(I) = AMP(I)/SCALE
C               AMP(I) = 20.0*ALOG10(AMP(I))
C       6300    CONTINUE
C               WRITE (3) (AMP(I), I = 1,1024)
C               WRITE (3) (AMP(I), I = 1025,2048)
```

```
      CALL CLOSE(3)
      STOP
      END
      SUBROUTINE EOBFFT(XREAL,XIMAG,N,NU)
C-------------------------------------------------------------------
C     THIS FFT SUBROUTINE COMES FROM E. O. BRIGHAM'S BOOK 'THE FAST
C     FOURIER TRANSFORM', P. 164.
C
C     XREAL AND XIMAG ARE N-LONG ARRAYS AND  N = 2**NU.
C-------------------------------------------------------------------
      DIMENSION XREAL(N), XIMAG(N)
      N2 = N/2
      NU1 = NU - 1
      K = 0
      DO 100 L = 1,NU
102   DO 101 I = 1,N2
      P = IBITR(K/2**NU1,NU)
      ARG = 6.283185*P/N
      C = COS(ARG)
      S = SIN(ARG)
      K1 = K + 1
      K1N2 = K1 + N2
      TREAL = XREAL(K1N2)*C + XIMAG(K1N2)*S
      TIMAG = XIMAG(K1N2)*C - XREAL(K1N2)*S
      XREAL(K1N2) = XREAL(K1) - TREAL
      XIMAG(K1N2) = XIMAG(K1) - TIMAG
      XREAL(K1) = XREAL(K1) + TREAL
      XIMAG(K1) = XIMAG(K1) + TIMAG
101   K = K + 1
      K = K + N2
      IF (K .LT. N) GO TO 102
      K = 0
      NU1 = NU1 - 1
100   N2 = N2/2
      DO 103 K = 1,N
      I = IBITR(K - 1,NU) + 1
      IF (I .LE. K) GO TO 103
      TREAL = XREAL(K)
      TIMAG = XIMAG(K)
      XREAL(K) = XREAL(I)
      XIMAG(K) = XIMAG(I)
      XREAL(I) = TREAL
      XIMAG(I) = TIMAG
103   CONTINUE
      RETURN
      END
      FUNCTION IBITR(J,NU)
      J1 = J
      IBITR = 0
      DO 200 I = 1,NU
      J2 = J1/2
      IBITR = IBITR*2 + J1 - 2*J2
200   J1 = J2
      RETURN
      END
```

Although the invention has been described and illustrated in detail, it is to be clearly understood that the same is by way of illustration and example only and is not to be taken by way of limitation. The spirit and scope of this invention are to be limited only by the terms of the appended claims.

We claim:

1. A method for determining the noise power ratio of a unit under test utilizing a general purpose digital computer, comprising the steps of:
   prompting an operator to input to the computer various parameters which define a desired test spectrum;
   generating a frequency domain representation signal of said desired test spectrum, said spectrum having a notch of predetermined depth;
   transforming said frequency domain representation signal into an input signal sequence defining a time domain representation thereof;
   applying said input signal sequence to said unit under test;
   receiving an output signal sequence from said unit under test defining a time domain representation of a measured test spectrum;
   transforming said output signal sequence into a frequency domain representation signal having a notch of measured depth; and
   calculating said noise power ratio in dB of said unit under test by taking the ratio of the notch depths of frequency domain representation signals for said desired and measured test spectrums.

2. The method for determining the noise power ratio of a unit under test as described in claim 1 wherein the step of prompting includes prompting the operator to select a notch center frequency and notch width of the desired test spectrum.

3. The method for determining the noise power ratio of a unit under test as described in claim 1 wherein the step of prompting includes prompting the operator to select upper and lower 3 dB frequencies of the desired test spectrum.

4. The method for determining the noise power ratio of a unit under test as described in claim 1 wherein the step of prompting includes prompting the operator to select a digital sample frequency, and a receive notch frequency for accommodating frequency translations of said input signal sequence applied to said unit under test.

5. The method for determining the noise power ratio of a unit under test as set forth in claim 1 further including the step of storing said input signal sequence in digital form before applying said input signal sequence to the unit under test.

6. The method for determining the noise power ratio of a unit under test as described in claim 5 further including the step of selectively converting said input signal sequence from digital to analog from before applying said input signal sequence to the unit under test.

7. The method for determining the noise power ratio of a unit under test as described in claim 1 further including the step of selectively converting said output signal sequence to digital form if received in analog form.

8. The method for determining the noise power ratio of a unit under test as described in claim 7 further including the step of storing said output signal sequence in digital form before said transformation into the frequency domain representation.

9. The method for determining the noise power ratio of a unit under test as described in claim 1 wherein the notch depth of the desired test spectrum is greater than or equal to the noise power ratio of said unit under test.

10. A test apparatus for use in determining the noise power ratio of a unit under test, comprising:
- means for producing a frequency domain representation signal of a desired test spectrum, said spectrum having a notch of predetermined depth;
- first means for transforming said frequency domain representation signal to an input signal sequence defining a time domain representation thereof;
- means for applying said input signal sequence to said unit under test;
- means for receiving an output signal sequence from said unit under test defining a time domain representation of a measured test spectrum;
- second means for transforming said output signal sequence into a frequency domain representation signal having a notch of measured depth; and
- means for calculating the noise power ratio of said unit under test by taking the ratio of the notch depths of the frequency domain representation signal for said desired and measured test spectrums.

11. The test apparatus as described in claim 10 including means selectively connected to said first transformation means for storing a digital representation of said input signal sequence.

12. The test apparatus as described in claim 11 further including means for converting said digital representation to analog form.

13. The test apparatus as described in claim 11 further including means for converting said output signal sequence to digital form if received in analog form.

14. The test apparatus as described in claim 13 further including means selectively connected to said second transformation means for storing said output signal sequence in digital form.

15. The test apparatus as described in claim 10 wherein said first transformation means computes an inverse Fast Fourier Transform algorithm.

16. The test apparatus as described in claim 10 wherein said second transformation means computes a Fast Fourier Transform algorithm.

17. The test apparatus as described in claim 10 further including means for selecting various parameters of said desired test spectrum.

18. The test apparatus as described in claim 17 wherein said selection means is a keyboard through which an operator inputs said parameters in response to a prompting scheme displayed thereto on a display.

* * * * *